US006944029B1

(12) United States Patent
Marcolina et al.

(10) Patent No.: US 6,944,029 B1
(45) Date of Patent: Sep. 13, 2005

(54) ELECTRICAL CIRCUIT PACK EJECTOR SYSTEM THAT PROVIDES A PREEMPTIVE WARNING TO THE CIRCUIT PACK

(75) Inventors: John Robert Marcolina, Saratoga, CA (US); Charles Matthew Erwin, San Jose, CA (US)

(73) Assignee: Ciena, Linthicum, MD (US)

( * ) Notice: Subject to any disclaimer, the term of this patent is extended or adjusted under 35 U.S.C. 154(b) by 5 days.

(21) Appl. No.: 10/631,769

(22) Filed: Aug. 1, 2003

(51) Int. Cl.[7] .......................... H05K 5/00; H05K 5/04; H05K 5/06

(52) U.S. Cl. ...................... 361/754; 361/759; 361/732; 361/740; 361/747; 439/160

(58) Field of Search ............................... 361/679–683, 361/686, 724–727, 728, 731, 732, 736, 740, 361/741, 747, 748, 754, 756, 759, 781, 788, 361/796, 798, 801, 802; 439/157, 160, 188, 439/911

(56) References Cited

U.S. PATENT DOCUMENTS 6,128,198 A * 10/2000 Kurrer et al. ............... 361/759

* cited by examiner

Primary Examiner—Phuong T. Vu
(74) Attorney, Agent, or Firm—Michael R. Cammarata; David L. Seltz; James M. Olsen

(57) ABSTRACT

An electrical circuit pack ejector system provides a preemptive warning to the circuit pack that allows redirection and disabling of circuit pack functionality prior to ejection and subsequent disconnection of power and input/output signal contacts. The ejector system is based on proximity detection that measures the distance between a Hall-effect sensor and a magnet affixed to an ejector arm. The magnetic field strength increases as the magnet approaches the sensor. Once the sensor threshold is reached, a logical bit from the sensor is flipped and a positive ejector engagement is surmised. As the ejector arm rotates away from the sensor, the magnetic field strength around the sensor is reduced. Once the sensor threshold is reached, a logical bit from the sensor is flipped and a negative ejector engagement is surmised. The circuit pack then redirects and disables functions prior to the power and signal connectors physical disengagement.

14 Claims, 1 Drawing Sheet

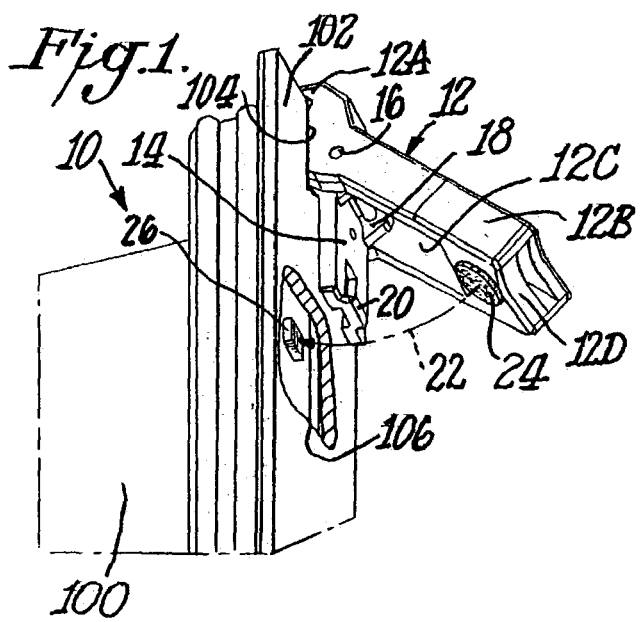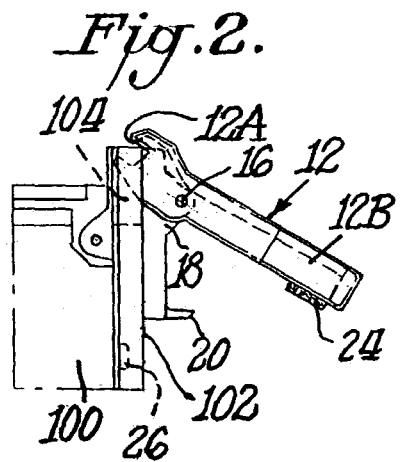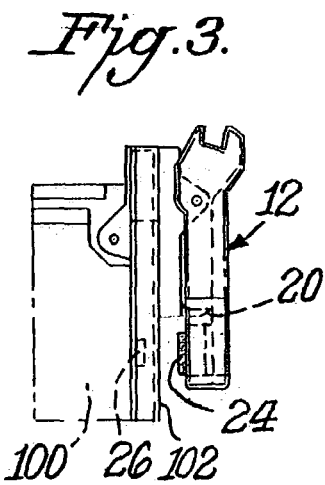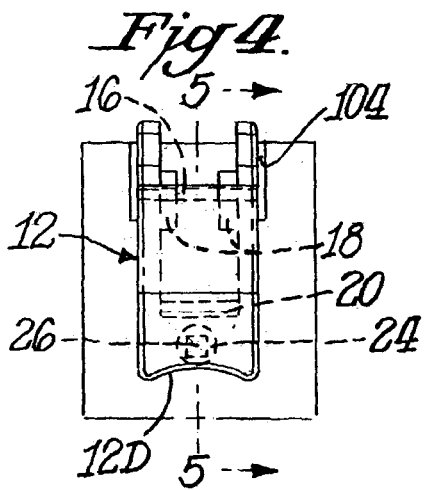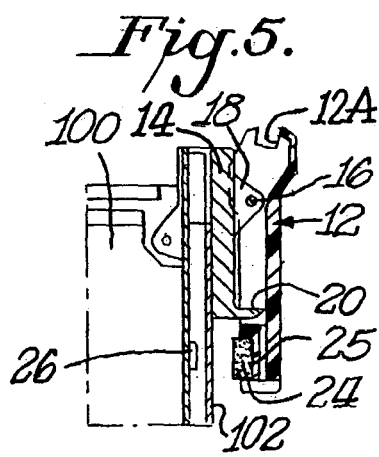

ELECTRICAL CIRCUIT PACK EJECTOR SYSTEM THAT PROVIDES A PREEMPTIVE WARNING TO THE CIRCUIT PACK

BACKGROUND OF THE INVENTION

A. Field of the Invention

The present invention relates generally to the optical communications or telecommunications field, and, more particularly to an electrical circuit pack ejector system that provides a preemptive warning to the circuit pack.

B. Description of the Related Art

Electrical circuit packs or circuit packs include a circuit board with components mounted thereon and a connector on one edge of the board. In a typical interconnection scheme, a plurality of pins is provided through a backplane mounted at the far end of a shelf. Each pack is inserted vertically or horizontally into the shelf (also known as a "subrack") on guideways so that the connector engages the appropriate pins for connection to that circuit pack when the circuit pack is in its final position. The circuit pack is usually inserted into the backplane using a lever, sometimes referred to as a latch, injector-ejector, or circuit pack ejector system.

Historically, most telecommunication equipment requires the physical shut down (powering off) of the entire system prior to servicing an individual circuit pack. For this reason, most commercially-available circuit pack ejector systems do not require or include a mechanism for detecting the activation of an ejector arm and subsequent circuit pack ejection. However, modern telecommunications equipment vendors now offer "hot-swappable" circuit packs that allow an individual circuit pack to be serviced without disabling other adjacent operating circuit packs. In addition, some systems require "hitless" removal of circuit packs, where removal of a circuit pack does not affect data traffic on other circuit packs in the system. To accomplish this, the logic on the circuit pack needs to be shutdown prior to circuit pack removal, which requires advanced notification that removal is going to occur. Without this advanced notification, signals may be transitioning on the circuit pack backplane when removal occurs, adversely affecting data on other circuit packs in the system.

To combat the issue, some vendors now offer "intelligent" ejector systems with an integrated mechanism providing an advanced warning to the system that a circuit pack is being removed for service. Some examples of such ejector systems include the Ripac CompactPCI injector/extractor handle available from Rittal Corporation of Springfield, Ohio, and the CPCI handles available from Elma Electronic, Inc. of Fremont, Calif.

Unfortunately, currently available "intelligent" ejector systems use a mechanical switch to provide preemptive circuit pack ejection feedback. Such mechanical-based ejector systems suffer from several drawbacks. First, such systems are expensive due to the number of components in such ejector systems, and the assembly time required for such systems. Second, existing ejector systems use springs, levels, and other mechanical contacts as a switch mechanism, which are susceptible to damage and wear.

Third, mechanical-type switches require additional circuitry on the circuit pack to "debounce" the switch mechanism. When a mechanical switch closes, the switch contacts do not instantly and finally close. Rather, the contacts close and then bounce open. This cycle repeats for a period of time, depending upon the switch-manufacturing technology. Thus, mechanical switches need additional circuitry to "debounce" the switch and accommodate for this situation. This additional circuitry prevents microscopic switch contact chatter from generating a false positive on or off condition.

Finally, mechanical-based ejector systems require cutouts or openings in circuit pack faceplates typically for sensor switches, plungers, optical windows, etc. Such faceplate openings are sources of electromagnetic interference ("EMI") since a circuit pack faceplate is part of a Faraday cage or conductive case shield that protects the circuit pack components within from EMI. The strength and frequency of the EMI passing through the faceplate openings is a function of three variables: the size of the opening, depth of the opening, and the strength of the source of the EMI.

Thus there is a need in the art for an electrical circuit pack ejector system that provides a preemptive warning to the circuit pack and overcomes the problems of the related art.

SUMMARY OF THE INVENTION

The present invention solves the problems of the related art by providing an electrical circuit pack ejector system that provides a preemptive warning to the circuit pack, permitting redirection and disablement of critical circuit pack functionality prior to circuit pack ejection and subsequent disconnection of the circuit pack power and input/output signal contacts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a fragmental perspective view of a circuit pack ejector system in accordance with an aspect of the present invention and showing an ejector arm in the open, electrical shutdown position;

FIG. 2 is a fragmental side elevational view of the circuit pack ejector system shown in FIG. 1;

FIG. 3 is a fragmental side elevational view of the circuit pack ejector system shown in FIG. 1 and showing the ejector arm in the closed, electrical power on position;

FIG. 4 is a front elevational view of FIG. 3; and

FIG. 5 is a fragmental cross-sectional view in elevation taken along line 5—5 of FIG. 4.

DETAILED DESCRIPTION OF EMBODIMENTS OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The ejector system of the present invention may be used with systems having circuit packs that can be removed without powering off the system (also referred to as "hot-swapped" circuit packs). In these systems it is possible that removing a circuit pack may disturb data paths on other circuit packs, resulting in data loss. In addition, for circuit packs with central processing units ("CPUs") that contain non-volatile memory, data corruption may result in the non-volatile memory if the CPU is writing to the non-volatile memory when the circuit pack is removed.

The circuit pack ejector system of the present invention provides a mechanism that warns the circuitry on the circuit pack that removal is imminent to allow the logic on the circuit pack to gracefully shut itself down, preventing data loss and memory corruption. The present invention is for use with circuit packs that use a card ejector system, which facilitates removal and insertion of the circuit pack. The early warning signal relies on the movement of the ejector just prior to removal of the circuit pack to generate the early warning signal.

The circuit pack ejector system of the present invention is shown in FIGS. 1–5, and is generally designated as reference numeral 10. FIGS. 1 and 2 show the ejector system 10 in an open position, whereas FIGS. 3–5 show the ejector system 10 in a closed position. When ejector system 10 is in the "open" position, ejector system 10 warns the circuitry on the circuit pack that removal is imminent to allow the logic on the circuit pack to gracefully shut down. When ejector system 10 is in the "closed" position, the circuitry on the circuit pack should be fully powered and performing its normal functions. The circuit pack may include a printed circuit board ("PCB") 100 or a plurality of PCBs 100 provided behind a faceplate 102. Faceplate 102 may include a slot 104 for receiving the ejector system 10 of the present invention.

Ejector system 10 includes an ejector arm 12 pivotally connected to a pivot bracket 14 attached to faceplate 102. Pivot bracket 14 may attach to faceplate 102 with a variety of connectors, including but not limited to mechanical connectors (screws, nuts and bolts, etc.), adhesive connectors (glue, solder, tape, etc.), etc. Pivot bracket 14 includes a pair of pivot yokes 18 that receive a pivot pin 16 provided through an upper portion 12A of ejector arm 12. Pivot pin 16 and pivot yokes 18 pivotally connect ejector arm 12 to pivot bracket 14. Ejector arm 12 pivots about pivot pin 16 in a path 22 shown in FIG. 1. Pivot bracket 14 further includes an ejector arm stop 20 that is received in an opening 12C of a lower portion 12B of ejector arm 12 and engages a top wall of ejector arm 12 when ejector system 10 is in its closed position, as best shown in FIGS. 3 and 5. Ejector arm stop 20 prevents ejector arm 12 from rotating into engagement with faceplate 102.

Upper portion 12A of ejector arm 12 includes a U-shaped stop that is received in slot 104 of faceplate 102. Slot 104 may be slightly larger than the U-shaped stop to enable ejector arm 12 to pivotally rotate towards and away from pivot bracket 14. Lower portion 12B of ejector arm 12 may further include a finger recess 12D that facilitates opening and closing of ejector arm 12.

The early warning feature of the present invention is accomplished through the use of a proximity detection arrangement that includes a permanent magnet 24 and a Hall-effect sensor 26. As shown in FIG. 1, magnet 24 may be affixed to the ejector arm 12, and Hall-effect sensor 26 may be mounted on and electrically coupled to the printed circuit board 100 of the circuit pack. FIG. 1 shows a break away 106 in faceplate 102 so that magnet 24 may be seen behind faceplate 102. Faceplate 102 does not have such a physical break away 106, but rather is a solid piece of material with no cutouts or openings provided therein. Hall-effect sensor 26 can detect the magnetic field of magnet 24 through the non-ferrous (i.e., aluminum, stainless steel, plastic, etc.) solid wall of faceplate 102.

As can be seen in FIGS. 1–5, ejector handle 12 and magnet 24 rotate into close proximity to Hall-effect sensor 26 when ejector arm 12 is closed (FIGS. 3–5), which occurs when the circuit pack is inserted into a shelf or subrack (not shown). FIG. 4 shows how magnet 24 aligns with Hall-effect sensor 26. The magnetic field strength increases as magnet 24 approaches sensor 26 until a predetermined sensor threshold is reached. Hall-effect sensor 26 turns on when ejector arm 12 and magnet 24 rotates into close proximity to Hall-effect sensor 26 which causes the voltage level on a sensor output pin of Hall-effect sensor 26 to change state. A logical bit from sensor 26 is flipped and a positive ejector engagement is surmised.

When the circuit pack is removed, the ejector arm 12 is unlatched and rotated open (as shown in FIGS. 1 and 2), allowing the lever action of ejector arm 12 to disengage a circuit pack backplane connector. Before the circuit pack backplane connector begins to move, magnet 24 rotates away from Hall-effect sensor 26, decreasing the magnetic field strength of magnet 24 on sensor 26. The magnetic field decreases until a predetermined sensor threshold is reached. The sensor threshold is the sensor's sensitivity to the magnetic field produced by the magnet 24. Each type of sensor has a different sensitivity. In addition, magnets of different sizes and shapes have unique field strengths. Thus, the appropriate sensor and magnet combination must be selected so that the sensor detects the magnetic field at the exact distance required by the physical design of the assembly. A logical bit from sensor 26 is then flipped and a negative ejector engagement is surmised. The change of state of Hall-effect sensor 26 is used to generate the early warning signal needed to shut down the circuit pack. Since Hall-effect sensor 26 employs hysteresis, the output signal requires no signal conditioning ("debouncing"), as is the case when mechanical switches are used.

Magnet 24 may be connected to lower portion 12B of ejector arm 12 in a variety of ways. For example, magnet 24 may be press fitted into a recess 25 formed in ejector arm 12 as shown in FIG. 5, which is a low cost manufacturing process. Alternatively, magnet 24 may be glued, soldered, taped, etc. to ejector arm 12. Ejector arm 12 or at least upper portion 12B of ejector arm 12 may be constructed of a material that attracts magnet 24, e.g., a magnetic material of opposite polarity to the polarity of magnet 24, a metallic material, etc. In this configuration, the magnetic forces of magnet 24 would cause magnet 24 to adhere to ejector arm 12.

Hall-effect sensor 26 may be mechanically and electrically connected to PCB 100 in a variety of ways, including but not limited to soldering, pins, etc. Sensor 26 may connect to the PCB 100 in a variety of ways, including, for example, directly (via solder, etc.) or indirectly (via a wire cable, flex circuit, etc.).

FIG. 5 is a fragmental cross-sectional view in elevation taken along line 5—5 of FIG. 4 and showing some of the possible materials making up the components of the present invention. As shown, faceplate 102 may be a non-ferrous (i.e., aluminum, stainless steel, plastic, etc.) solid wall.

Ejector arm 12 and pivot arm 14 may be made from a variety of materials, including but not limited to plastic, stainless steel, etc.

The circuit pack ejector system 10 of the present invention provides several advantages over existing ejector system products. First, openings in circuit pack faceplates typically used for sensor switches, plungers, optical windows, etc. are not required with the present-invention since Hall-effect sensor 26 may detect magnetic fields from magnet 24 through non-ferrous (i.e. aluminum, stainless steel, plastics, etc.) solid faceplate 102 walls. Eliminating these openings effectively reduces the radiated EMI emissions from circuit pack electronics. In addition, integrated ejector switches are sometimes mounted on the outside of the circuit pack faceplate with the ejector assembly, and require a cable assembly to electrically connect the switch to the circuit pack. The external switch and cable assembly may be sources of radiated EMI emissions. The ejector system 10 of the present invention does not require external switches or cable assemblies or openings in faceplate 102, eliminating these potential sources of EMI.

Second, the finished assembly costs of the ejector system 10 of the present invention are less expensive than other commercially-available alternatives due to fewer parts in the ejector system 10 assembly, reduced assembly time, and less expensive assembly processes.

Third, due to the solid-state nature of Hall-effect sensor 26, no moving parts are required for the switch functionality of the present invention. Many existing commercial products use springs, levers, and other mechanical contacts as a switch mechanism. These product designs are inherently susceptible to damage and wear. Whereas the ejector system 10 of the present invention does not experience any performance degradation regardless of the number of usage cycles.

Finally, mechanical-type switches usually require additional circuitry on the circuit pack to "debounce" the switch mechanism. This additional circuitry prevents microscopic switch contact chatter from generating a false positive "on" or "off" condition. This debounce time also reduces the early warning time that is available for the circuit pack to properly shut down. Due to the integrated hysteresis functionality of Hall-effect sensor 26 of the present invention, this additional circuitry is not required.

It will be apparent to those skilled in the art that various modifications and variations can be made in the circuit pack ejector system of the present invention and in construction of this system without departing from the scope or spirit of the invention.

As an example, pivot bracket 14 maybe integrally formed with faceplate 102 so that ejector arm 12 may be pivotally connected to faceplate 102 directly. Furthermore, Hall-effect sensor 26 may be provided on ejector arm 12, and magnet 24 may be connected to faceplate 102. In such an arrangement, however, an external cable connecting sensor 26 to PCB 100 would be required.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An ejector system, comprising:
a circuit pack having a printed circuit board, a faceplate, and a power supply;
a pivot bracket connected to the faceplate;
an ejector arm pivotally connected to said pivot bracket and including a magnet on a lower surface thereof, the lower surface of said ejector arm facing the faceplate, said ejector arm being pivotable towards and away from the faceplate; and
a sensor electrically coupled to and connected to the printed circuit board, said sensor providing a preemptive warning to said circuit pack when said ejector arm and the magnet are pivoted away from the faceplate;
said circuit pack disabling critical functions of said circuit pack in response to the preemptive warning and prior to disconnection of the power supply to the circuit pack.

2. An ejector system as recited in claim 1, wherein said sensor comprises a Hall-effect sensor.

3. An ejector system as recited in claim 1, wherein said sensor is energized when said ejector arm and the magnet are pivoted toward the faceplate and in close proximity to said sensor.

4. An ejector system as recited in claim 1, wherein said circuit pack is removed by pivoting said ejector arm away from the faceplate, allowing the lever action of said ejector arm to disengage a circuit pack backplane connector.

5. An ejector system as recited in claim 4, wherein before the circuit pack backplane connector is disengaged, said sensor generates the preemptive warning.

6. An ejector system as recited in claim 1, wherein said sensor and the magnet are provided on opposite sides of the faceplate.

7. An ejector as recited in claim 6, wherein said sensor detects the magnetic field of the magnet through the faceplate.

8. An ejector system as recited in claim 7, wherein the faceplate comprises a non-ferrous solid wall.

9. A method, comprising:
pivoting an ejector arm away from a faceplate of a circuit pack, the ejector arm including a magnet on a lower surface thereof, the lower surface of the ejector arm facing the faceplate;
providing a preemptive warning to the circuit pack with a Hall-effect sensor electrically coupled to and connected to a printed circuit board of the circuit pack when the ejector arm and the magnet are pivoted away from the faceplate; and
disabling critical functions of the circuit pack in response to the preemptive warning and prior to disconnection of a power supply to the circuit pack.

10. A method as recited in claim 9, further comprising:
removing the circuit pack by pivoting the ejector arm away from the faceplate, and allowing the lever action of the ejector arm to disengage a circuit pack backplane connector.

11. A method of as recited in claim 10, wherein before the circuit pack backplane connector is disengaged, the sensor generates the preemptive warning.

12. An ejector system, comprising:
a circuit pack having a printed circuit board, a faceplate, and a power supply;
a pivot bracket connected to the faceplate;
an ejector arm pivotally connected to said pivot bracket and including a sensor on a lower surface thereof, the lower surface of said ejector arm facing the faceplate, said ejector arm being pivotable towards and away from the faceplate; and
a magnet connected to the faceplate, wherein the sensor electrically couples to and connects to the printed circuit board, the sensor providing a preemptive warning to said circuit pack when said ejector arm and the sensor are pivoted away from the faceplate and said magnet;

said circuit pack disabling critical functions of said circuit pack in response to the preemptive warning and prior to disconnection of the power supply to the circuit pack.

13. An ejector system as recited in claim 12, said circuit pack further including signal connectors for telecommunication signals, said circuit pack disabling critical functions, including redirecting the telecommunication signals, in response to the preemptive warning.

14. An ejector system as recited in claim 1, said circuit pack further including signal connectors for telecommunication signals, said circuit pack disabling critical functions, including redirecting the telecommunication signals, in response to the preemptive warning.

\* \* \* \* \*